US009291794B2

(12) United States Patent
Zhu et al.

(10) Patent No.: US 9,291,794 B2
(45) Date of Patent: Mar. 22, 2016

(54) TEMPERATURE BALANCING DEVICE OF PROJECTION OBJECTIVE OF LITHOGRAPHY MACHINE AND METHOD THEREOF

(71) Applicant: Shanghai Huali Microelectronics Corporation, Shanghai (CN)

(72) Inventors: Jun Zhu, Shanghai (CN); Lijun Chen, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 418 days.

(21) Appl. No.: 13/682,069

(22) Filed: Nov. 20, 2012

(65) Prior Publication Data
US 2013/0128243 A1    May 23, 2013

(30) Foreign Application Priority Data
Nov. 22, 2011    (CN) .......................... 2011 1 0374963

(51) Int. Cl.
G02B 7/00 (2006.01)
G02B 7/02 (2006.01)
G03F 7/20 (2006.01)

(52) U.S. Cl.
CPC ............... *G02B 7/008* (2013.01); *G02B 7/028* (2013.01); *G03F 7/70891* (2013.01)

(58) Field of Classification Search
CPC ..... G02B 7/008; G02B 7/028; G03F 7/70891

USPC ................... 355/30, 52, 53, 55, 77
See application file for complete search history.

(56) References Cited

U.S. PATENT DOCUMENTS

| 2003/0043352 | A1* | 3/2003 | Sudoh et al. | ..................... 355/40 |
| 2005/0140947 | A1* | 6/2005 | Miyajima | ....................... 355/30 |
| 2010/0173236 | A1* | 7/2010 | Yasunobe et al. | ............... 430/30 |

FOREIGN PATENT DOCUMENTS

JP    63266821 A  * 11/1988  ............. H01L 21/30

* cited by examiner

*Primary Examiner* — Toan Ton
*Assistant Examiner* — Mona M Sanei
(74) *Attorney, Agent, or Firm* — Anova Law Group, PLLC

(57) ABSTRACT

The invention provides a temperature balancing device for a projection objective of a lithography machine. The device comprises at least one temperature sensor, at least one heat-absorbing light-transmitting layer and an objective temperature balancing control unit, wherein the temperature sensor is disposed adjacent to the projection objective for sensing the temperature difference of the projection objective in different areas; the heat-absorbing light-transmitting layer is positioned below the projection objective for absorbing radiation energy in the laser beams transmitted from the lithography machine and transmitting the laser beams; and the objective temperature balancing control unit is used for controlling the absorption degree and light transmission degree of the heat-absorbing light-transmitting layer according to the temperature difference sensed by the temperature sensor. The invention also discloses a method for balancing temperature of a projection objective of a lithography machine.

11 Claims, 3 Drawing Sheets

TEMPERATURE BALANCING DEVICE OF PROJECTION OBJECTIVE OF LITHOGRAPHY MACHINE AND METHOD THEREOF

CROSS-REFERENCE TO RELATED APPLICATION

This application claims the priority benefit of China application serial no. 201110374963.4, filed Nov. 22, 2011. All disclosure of the China application is incorporated herein by reference.

FIELD OF THE INVENTION

The present invention relates to a temperature balancing device of the projection objective of a lithography machine and a temperature balancing method.

BACKGROUND OF THE INVENTION

In the lithographical process for silicon wafers using photomask, after the project objective of the lithography machine being radiated by the laser beams from the lithography machine for a long time, the thermally induced mechanical deformations of the project objective may occurs. Generally, the project objective comprises multiple lenses. The heat absorbed in the lens on the top of the project objective is different with that absorbed in the lens at the bottom of the project objective, and such heat variation may induce different deformations in the top lens and the bottom lens, so as to cause magnification error during the exposure process. Therefore, the alignment precision between silicon wafers or between lots may be reduced in the continuous operation of the lithography machine. Furthermore, the heat from the laser beams during the lithographical process will be accumulated over the exposure time and the alignment errors between wafers or lots may not be avoided.

The Chinese patent No. 101609262 discloses a temperature control device of a projection object lens of a lithography machine. The temperature control device comprises at least one water sleeve which encloses the projection object lens, at least one temperature sensor disposed adjacent to the projection object lens, a flow distributing and collecting plate, a circulating water control unit and a temperature control unit of the projection object lens. The water sleeve comprises a water sleeve body and a water pipe double-spirally enwound on the outer wall of the water sleeve body; the temperature sensor is used for detecting the temperature of the projection object lens of the lithography machine; the flow distributing and collecting plate is connected with the water pipe of the water sleeve through a flow distributing and collecting pipe to provide circulating water for the water pipe of the water sleeve and receive recirculation water in the water pipe of the water sleeve body, and the flow distributing and collecting pipe is provided with an adjusting valve used for controlling the flow rate of the circulating water in the water pipe; the circulating water control unit controls the temperature of the circulating water and provides circulating water for the flow distributing and collecting plate through a transmission pipe; the temperature control unit of the projection object lens is used for receiving the temperature of the projection object lens detected by the temperature sensor and adjusting the temperature of the circulating water provided by the circulating water control unit and the opening degree of the adjusting valve according to the temperature of the projection object lens.

However, when the temperature of the bottom of the projection object lens is greatly below that of the other areas of the projection object lens, or the temperature of the projection object lens grows non-linearly from bottom to top, it may require a long time to realize the integral temperature uniformity of the projection object lens. In addition, the structure of the temperature control device is complicated which may bring inconvenience in installation and maintenance.

SUMMARY OF THE INVENTION

Accordingly, at least one objective of the present invention is to provide a device to realize the integral temperature uniformity of the projection objective of a lithography machine quickly, as well as to meet the demand of structural simplicity, and installation and maintenance convenience.

To achieve these and other advantages and in accordance with the objective of the invention, as embodied and broadly described herein, the invention provides a temperature balancing device for a projection objective of a lithography machine comprising at least one temperature sensor, at least one heat-absorbing light-transmitting layer and an objective temperature balancing control unit, wherein, the temperature sensor is disposed adjacent to the projection objective for sensing the temperature difference in different areas thereof; the heat-absorbing light-transmitting layer is positioned below the projection objective for absorbing radiation energy in the laser beams transmitted from the lithography machine and transmitting the laser beams; the objective temperature balancing control unit is used for controlling the absorption and light transmission degree of the heat-absorbing light-transmitting layer according to the temperature difference sensed by the temperature sensor.

Since the objective temperature balancing control unit can control the heat-absorbing light-transmitting layer to absorb the radiation energy in the laser beams from the lithography machine and transmit the laser beams according to the temperature difference sensed by the temperature sensor, when the temperature of the top of the projection objective is greatly higher than that of the bottom of the projection objective, the heat-absorbing light-transmitting layer can directly absorb the radiation energy and give off heat to raise the temperature of the bottom of the projection objective, so as to achieve the integral temperature uniformity quickly. Furthermore, since the heat-absorbing light-transmitting layer is disposed separately from the projection objective, the temperature balancing device has a simple structure and is convenient to install and maintain.

In a preferred embodiment of the present invention, the temperature balancing device comprises at least one component for accommodating the heat-absorbing light-transmitting layer. Further, the heat-absorbing light-transmitting layer is fixed on the component through a detachable connector. Therefore, the heat-absorbing light-transmitting layer can be replaced conveniently for maintenance.

In a preferred embodiment of the present invention, the heat-absorbing light-transmitting layer is a lens component including at least one lens coated with material capable of absorbing radiation energy. Further, the material is selected from one or more of organic thin film, alumina, zirconia, titanium oxide, cerium oxide, magnesium fluoride or calcium fluoride. Since the lens is coated with the material capable of absorbing radiation energy, using the lens component including such lens as the heat-absorbing light-transmitting layer can have a good light transmittance.

In a preferred embodiment of the present invention, multiple heat-absorbing light-transmitting layers are provided and the heat-absorbing light-transmitting layers are spaced evenly with different heat absorption rates. When the temperature sensor senses the variation of the temperature difference, the switch between the heat-absorbing light-transmitting layers with different heat absorption rate can be performed in accordance with a predetermined rule so as to increase the temperature of the bottom of the projection objective rapidly while keeping the temperature of the heat-absorbing light-transmitting layers and the integral projection object not too high.

The present invention further provides a method for balancing temperature of a projection objective of a lithography machine, comprising: step1, sensing the temperature difference in the different areas of the projection objective; step2, controlling the heat-absorbing light-transmitting layer to absorb radiation energy in the laser beams transmitted from the lithography machine and transmit the laser beams according to the temperature difference to raise the temperature of the area with lower temperature when the temperature difference of the different areas exceeds a predetermined threshold value. Further, the step 2 comprises step 21, disposing the heat-absorbing light-transmitting layer on at least one component; and step 22, controlling the component to enter into or move away from the radiation path of the laser beams according to the sensed temperature difference.

BRIEF DESCRIPTION OF THE DRAWINGS

The temperature balancing device for a projection objective of a lithography machine in accordance with the present invention will be elucidated by reference to the following embodiments and the accompanying drawings, in which.

DETAILED DESCRIPTION OF THE EMBODIMENTS

The temperature balancing device for a projection objective of a lithography machine of the present invention will be described in further details hereinafter with respect to the embodiments and the accompanying drawings.

Figure 1:
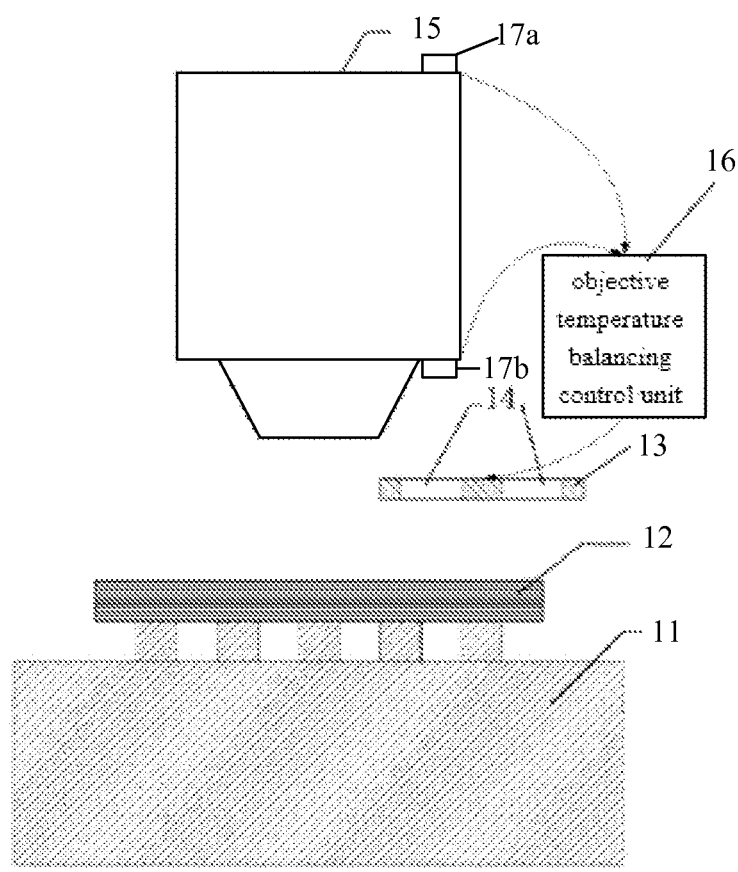
FIG. 1 is a schematic diagram of the temperature balancing device for a projection objective of a lithography machine in an embodiment of the present invention.

Referring to FIG. 1, a silicon wafer 12 is positioned on the silicon table 11 and the projection objective 15 of the lithography machine is configured to project laser beams onto the silicon wafer 12. The temperature balancing device for the projection objective comprises at least one temperature sensor, at least one heat-absorbing light-transmitting layer 14 disposed below the projection objective 15 and a objective temperature balancing control unit 16. In some embodiments of the present invention, the temperature balancing device further comprises at least one component 13 and the heat-absorbing light-transmitting layer 14 is disposed thereon.

In an embodiment, two temperature sensors are provided, and the temperature sensors are disposed at the top and bottom of the projection objective 15 respectively for sensing the temperature difference in different areas of the projection objective. If the temperature difference is little, the objective temperature balancing control unit 16 will control the component 13 as well as the heat-absorbing light-transmitting layer 14 to move away from the radiation path of the laser beams transmitted from the lithography machine, and the laser beams will be transmitted to the silicon wafer 12 on the silicon wafer table 11 directly through the projection objective 15. If the temperature difference is large, the objective temperature balancing control unit 16 will insert the component 13 as well as the heat-absorbing light-transmitting layer 14 below the projection objective 15, then the heat-absorbing light-transmitting layer 14 will absorb the radiation energy of the laser beams and transmit the laser beams to raise the temperature of the bottom of the projection objective 15 and the integral temperature uniformity of the projection objective 15 can be achieved. If the temperature difference is gradually reduced to less than a predetermined threshold valve, the objective temperature balancing control unit 16 will control the component 13 and the heat-absorbing light-transmitting layer 14 to move away from the radiation path of the laser beams transmitted from the lithography machine. Wherein, the heat-absorbing light-transmitting layer 14 can be fixed on the component 13 through a detachable connector.

In an embodiment of the present invention, the heat-absorbing light-transmitting layer 14 is a lens component including at least one lens coated with material capable of absorbing radiation energy. For a lens component including multiple lenses, each lens is coated with the material capable of absorbing radiation energy, or only parts of the lenses are coated with the material. Using the lens component including lenses as the heat-absorbing light-transmitting layer 14 can increase the light transmittance.

In an embodiment of the present invention, the material capable of absorbing radiation energy can be organic thin film. The light intensity I (in candela) passing through the heat-absorbing light-transmitting layer 14 is related to the light intensity $I_o$ (in candela) not passing through the heat-absorbing light-transmitting layer 14, the film thickness T (in um) and the absorption coefficient K (in 1/um) of the organic thin film in accordance with the following formula: $I=I_o e^{-KT}$. Preferably, the absorption coefficient K of the organic thin film for the laser beams transmitted from the lithography machine is 0-1.

In another embodiment of the present invention, the materials capable of absorbing radiation energy can be one of more of alumina, zirconia, titanium oxide, cerium oxide, magnesium fluoride or calcium fluoride.

In addition, the heat-absorbing light-transmitting layer 14 can be organic light-transmitting thin film or heat-absorbing glass.

In some embodiments, multiple heat-absorbing light-transmitting layers 14 are provided. The heat-absorbing light-transmitting layers 14 are spaced evenly with different heat absorption rates. The objective temperature balancing control unit 16 selects different heat-absorbing light-transmitting layers 14 corresponding to the temperature difference sensed by the temperature sensor according to a predetermined rule, thus the temperature of the bottom of the projection objective will rise quickly while the temperature of the heat-absorbing light-transmitting layers and the integral projection objective keeps not too high.

Figure 2:
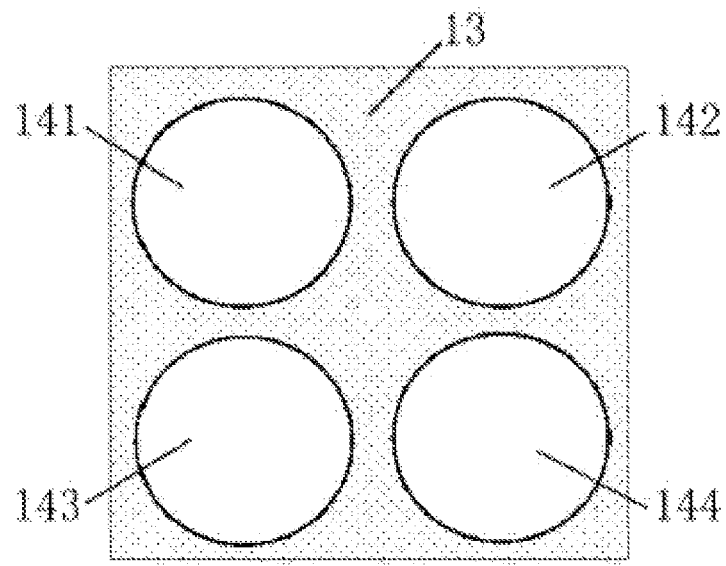
FIG. 2 is a schematic diagram of the component in a preferred embodiment of the present invention.

As shown in FIG. 2, in a preferred embodiment of the present invention, four heat-absorbing light-transmitting layers 141~444 with different heat absorption rates are evenly spaced on the component 13. Each of the heat-absorbing light-transmitting layers 141~144 is a lens component including one lens and the lens of each lens component is coated with an organic thin film capable of absorbing radiation energy. In accordance with the formula $I=I_o e^{-KT}$, the film thickness of the heat-absorbing light-transmitting layers 141~144 can be calculated to enable the absorption rate of the four heat-absorbing light-transmitting layers 141~144 reaching 25%, 50%, 75% and 100% respectively.

The temperature sensors disposed at the top and bottom of the projection objective 15 sense the temperatures of the top and bottom of the projection objective 15 in real time according to a predetermined rule. When the temperature difference between the top and bottom of the projection objective is greater than or equal to 0.1 degrees Celsius and less than 0.2 degrees Celsius, the objective temperature balancing control unit 16 will control the heat-absorbing light-transmitting layer 141 on the component 13 to enter into the radiation path of the laser beams transmitted from the lithography machine to absorb the radiation energy from the laser beams and radiate heat, so as to increase the temperature of the bottom of the projection objective 15; when the temperature difference is greater than or equal to 0.2 degrees Celsius and less than 0.25 degrees Celsius, the objective temperature balancing control unit 16 will control the heat-absorbing light-transmitting layer 142 to enter into the radiation path of the laser beams to absorb the radiation energy from the laser beams and give off heat, so as to raise the temperature of the bottom of the projection objective 15; when the temperature difference is greater than or equal to 0.3 degrees Celsius, the heat-absorbing light-transmitting layer 143 will be selected to enter into the radiation path of the laser beams; and when the temperature difference is gradually reduced to less than 0.1 degrees Celsius, the objective temperature balancing control unit 16 will move the component 13 away from below the projection objective 15.

Figure 3:
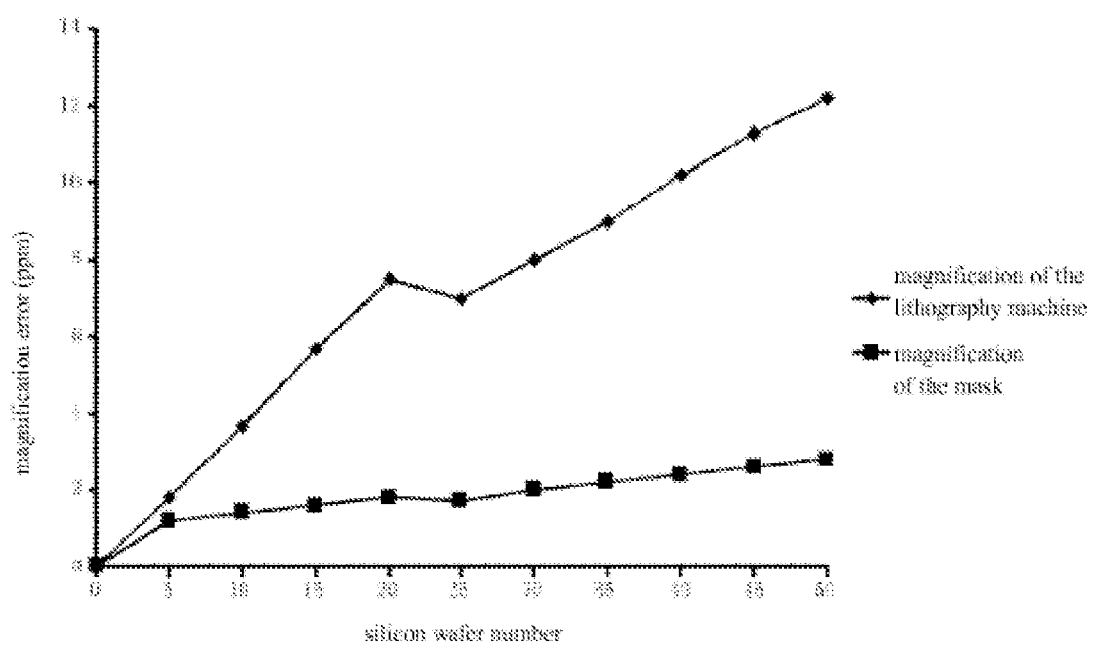
FIG. 3 is a curve graph showing the magnification of the lithography machine and that of the mask during a continuous exposure process for 50 silicon wafers in the prior art.
Figure 4:
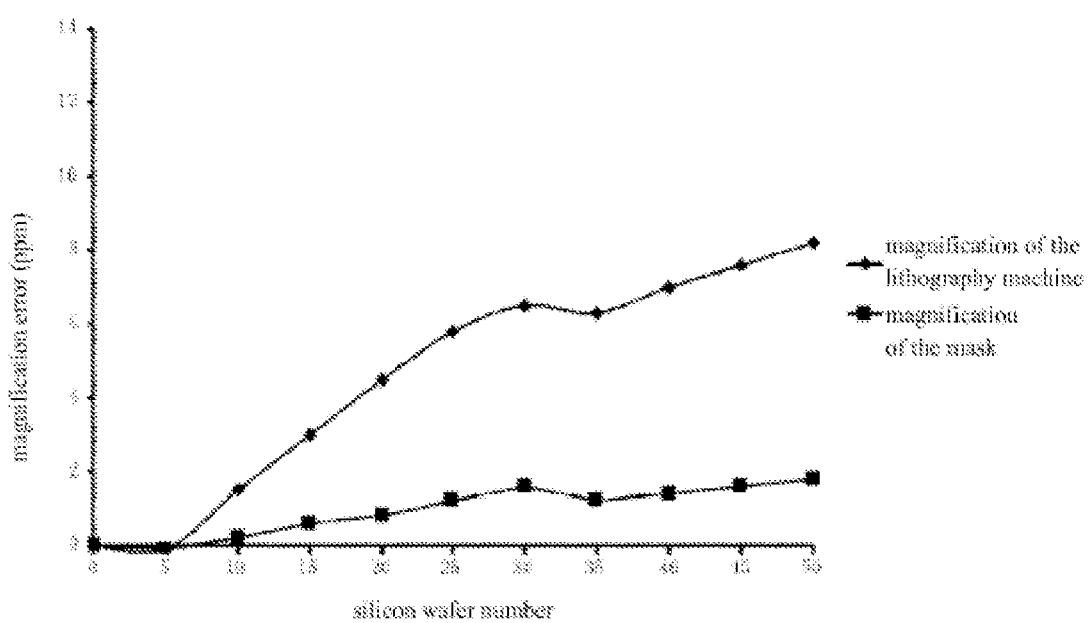
FIG. 4 is a curve graph showing the magnification of the lithography machine and that of the mask during a continuous exposure process for 50 silicon wafers using the temperature balancing device for a projection objective of a lithography machine in an embodiment of the invention.

FIG. 3 and FIG. 4 illustrate the magnification of the lithography machine and that of the mask during a continuous exposure process for 50 silicon wafers under the conditions of disusing and using the temperature balancing device. As can be seen, the magnification error of the lithography machine can be greatly reduced 33% from 12 ppm to 8 ppm, which equals to the edge overlay of a 300 mm sized silicon wafer increasing to 60 nm.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A temperature balancing device for a projection objective of a lithography machine comprising:
   a first temperature sensor disposed on a top of the projection objective and a second temperature sensor disposed at a bottom of the projection objective for sensing a temperature difference between the top and the bottom of the projection objective;
   a heat-absorbing light-transmitting layer positioned below the projection objective for absorbing radiation energy in laser beams transmitted from the lithography machine and transmitting the laser beams;
   an objective temperature balancing control unit for controlling an absorption and light transmission degree of the heat-absorbing light-transmitting layer according to the temperature difference sensed by the first and second temperature sensors, wherein when the temperature difference exceeds a predetermined threshold value, the objective temperature balancing control unit controls the heat-absorbing light-transmitting layer to directly absorb the radiation energy and give off heat to only raise the temperature of the bottom of the projection objective, so as to reduce the temperature difference between the top of the projection objective and the bottom of the projection objective.

2. The temperature balancing device according to claim 1, further comprising at least one component for accommodating the heat-absorbing light-transmitting layer.

3. The temperature balancing device according to claim 2, wherein the heat-absorbing light-transmitting layer is detachably fixed on the component.

4. The temperature balancing device according to claim 1, wherein the heat-absorbing light-transmitting layer is a lens component including at least one lens coated with material capable of absorbing radiation energy.

5. The temperature balancing device according to claim 4, wherein the material is organic thin film.

6. The temperature balancing device according to claim 5, wherein an absorption coefficient of the organic thin film for the laser beams transmitted from the lithography machine is 0-1 in 1/um.

7. The temperature balancing device according to claim 4, wherein the material is selected from one or more of alumina, zirconia, titanium oxide, cerium oxide, magnesium fluoride or calcium fluoride.

8. The temperature balancing device according to claim 1, wherein multiple heat-absorbing light-transmitting layers are provided and the multiple heat-absorbing light-transmitting layers are spaced evenly with different heat absorption rates.

9. The temperature balancing device according to claim 8, wherein four heat-absorbing light-transmitting layers are provided with the absorption rates of 25%, 50%, 75% and 100% respectively.

10. A method for balancing temperature of a projection objective of a lithography machine using the temperature balancing device according to claim 1 comprising:
   step1: sensing the temperature difference of the top and the bottom of the projection objective;
   step2: controlling the heat-absorbing light-transmitting layer to absorb radiation energy in the laser beams transmitted from the lithography machine and transmit the laser beams according to the temperature difference between the top and the bottom of the projection objective, wherein when the temperature difference exceeds the predetermined threshold value, controlling the heat-absorbing light-transmitting layer to directly absorb the radiation energy and give off heat to only raise the temperature of the bottom of the projection objective, so as to reduce the temperature difference between the top of the projection objective and the bottom of the projection objective.

11. The method according to claim 10, wherein step 2 further comprising:
   step 21: disposing the heat-absorbing light-transmitting layer on at least one component;
   step 22: controlling the component to enter into or move away from a radiation path of the laser beams according to the sensed temperature difference.

* * * * *